United States Patent
Ikeda et al.

(10) Patent No.: US 7,017,731 B2
(45) Date of Patent: Mar. 28, 2006

(54) ELECTRONIC COMPONENT CONVEYING DEVICE

(75) Inventors: Mitsuru Ikeda, Takefu (JP); Yoshikazu Sasaoka, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/810,891

(22) Filed: Mar. 29, 2004

(65) Prior Publication Data

US 2005/0010328 A1    Jan. 13, 2005

(30) Foreign Application Priority Data

Jun. 26, 2003    (JP) .............................. 2003-181958

(51) Int. Cl.
*B65G 43/08*    (2006.01)

(52) U.S. Cl. .............................. 198/464.3; 198/464.2; 209/573

(58) Field of Classification Search ................ 198/393, 198/464.2, 464.3; 209/573, 572, 910
See application file for complete search history.

(56) References Cited

U.S. PATENT DOCUMENTS 5,454,464 A * 10/1995 Yamamoto et al. ......... 198/384
5,842,579 A    12/1998 Garcia et al.
6,906,508 B1 *  6/2005 Saulnier et al. .......... 324/158.1

FOREIGN PATENT DOCUMENTS

| JP | 05-286547 | 11/1993 |
| JP | 06-144407 | 5/1994 |
| JP | 08-052624 | 2/1996 |
| JP | 08-204388 | 8/1996 |
| JP | 2002-217594 | 8/2002 |

\* cited by examiner

*Primary Examiner*—James R. Bidwell
(74) *Attorney, Agent, or Firm*—Keating & Bennett, LLP

(57) ABSTRACT

An electronic-component conveying device includes a conveying plate which moves in one conveying direction and has a plurality of component-holders arranged at a predetermined pitch along the conveying direction. This conveying device further includes component-containers each containing a plurality of electronic components for supplying the components to the holders. The electronic components are held by the holders while being conveyed by the conveying plate. Cameras, i.e. a component-detecting unit, are provided for detecting the presence of the electronic components in the holders. A controller, i.e. a component-feeding unit, is provided for feeding additional electronic components to each of the containers based on the detection of the presence of the electronic components.

18 Claims, 7 Drawing Sheets

CONVEYING PATH A
CONVEYING PATH B
CONVEYING PATH C

SUPPLIED RATE VERSUS NUMBER OF ELECTRONIC
COMPONENTS IN COMPONENT-HOLDERS

ELECTRONIC COMPONENT CONVEYING DEVICE

BACKGROUND OF THE INVENTION

1. Field of the Invention

The present invention relates to electronic-component conveying devices for conveying multiple electronic components which are arranged at a predetermined pitch. In particular, an electronic-component conveying device according to the present invention is suitable for inspection devices which measure electrical properties of electronic components for sorting out defective components from non-defective components.

2. Description of the Related Art

FIGS. 5 and 6 illustrate a conventional inspection device, such as the one disclosed in U.S. Pat. No. 5,842,579, which measures electrical properties of electronic components to sort out defective components from non-defective components. Such a device is provided with a conveying plate 20 having multiple component-holders 20a arranged in three lines. The holders 20a in each line are arranged at a predetermined pitch along a conveying direction α of the conveying plate 20. The device is further provided with component-containers 21, 22, and 23 which are respectively disposed above conveying paths A, B, and C, i.e. the three lines, of the conveying plate 20. The containers 21, 22, and 23 hold electronic components W. Each electronic component W is supplied to one of the component-holders 20a. The conveying plate 20 is rotated intermittently so as to convey the components W to an electrical-property inspection unit, not shown in the drawings, of the subsequent step.

To allow continuous processing of the electronic components W, the containers 21, 22, and 23 are respectively provided with level sensors 24, 25, and 26. When the components W in one of the containers 21, 22, and 23 decrease and therefore cannot be detected by the corresponding one of the level sensors 24 to 26, additional electronic components W are fed to the component-container. The feeding of the components W is stopped at the point in which these additional components W are detected.

In an inspection device of this type, when the feeding of the electronic components W is aborted to switch to another production lot, for example, if there are components W remaining in the containers 21 to 23 at this aborting point, the device carries on with its operation until the inspection for the remaining components W is completed.

In such a conventional inspection device, however, the electronic components W are fed when the detected containing level of the components W in each component-container falls below a certain level. Even if a certain problem occurs in one of the containers 21 to 23 and the components W are not supplied to the conveying plate 20, the device will continue its operation regardless of the state in which one of the conveying paths of the conveying plate 20 may have empty component-holders. Accordingly, this may lower the operational efficiency.

Furthermore, as described above, from the aborting time of the feeding of the electronic components W, such a conventional inspection device continues its operation until the inspection for all remaining components W in the containers 21 to 23 is completed. For this reason, if there are differences in the number of components W among the containers 21 to 23, the device must continue the operation in a state where some of the conveying paths may have empty component-holders. This may lower the rate of operation. Referring to FIG. 5, for example, the container 21 in the left side of the drawing contains a small number of electronic components W, the container 22 in the center does not contain any components W, and the container 23 in the right side contains a large number of components W. Consequently, even though the processing efficiency is lowered to ⅓, the device must continue the operation. In a case where a conveying plate having two conveying paths is rotated intermittently at 0.1 second per tact, if there is a difference of 10,000 electronic components between the two component-containers of the conveying paths before switching to another production lot, the device must continue the operation for approximately 17 more minutes while the processing efficiency is lowered to ½.

Such a conventional inspection device detects the containing level of the electronic components in each component-container. As a result, if each electronic component has an extremely small size of, for example, 0.6 mm by 0.3 mm by 0.3 mm, a 1-cm$^3$ capacity would contain approximately 10,000 electronic components. Accordingly, when the detected objects are small in size, the detection may become difficult unless a certain number of the objects are present. As a result, the electronic components in each container must be large in number.

SUMMARY OF THE INVENTION

In order to overcome the problems described above, preferred embodiments of the present invention provide an electronic-component conveying device which ensures supplying of the electronic components to the conveying plate to prevent lowering of operational efficiency and which minimizes the difference in the number of electronic components among the component-containers to prevent lowering of the rate of operation.

An electronic-component conveying device according to a preferred embodiment of the present invention includes a conveying plate which moves in one conveying direction and which has a plurality of component-holders arranged at a predetermined pitch along the conveying direction, and component-containers each containing a plurality of electronic components. The electronic components are supplied to the holders from the containers and are held by the holders while being conveyed by the conveying plate. The electronic-component conveying device further includes a component-detecting unit for detecting the presence of the electronic components in the holders, and a component-feeding unit for feeding additional electronic components to each of the containers based on the detection of the presence of the electronic components.

Accordingly, the detection of the presence of the electronic components held by the component-holders allows for monitoring of each one of the electronic components on the conveying plate. For example, if any problem occurs in the containers and the electronic components are not supplied to the conveying plate, the device may quickly detect the dysfunctional supplying state. This prevents the conveying plate from rotating in a state where the plate may have empty component-holders, thus improving operational efficiency.

Based on the detection of the presence of the electronic components on the conveying plate, additional electronic components are fed to the corresponding container. This ensures the continuous supply of the electronic components to the conveying plate. Furthermore, the electronic components in each container may be stably controlled and maintained at a small amount. Accordingly, this shortens the time period between the aborting point of feeding of the electronic components and the termination point for the inspection of all remaining electronic components in the containers, thus improving the rate of operation.

In the electronic-component conveying device of preferred embodiments of the present invention, the component-feeding unit may feed a predetermined number of additional electronic components when the supplied rate of the electronic components in the component-holders falls below a certain rate, or when the number of empty component-holders exceeds a certain value.

Accordingly, efficient feeding of the electronic components may be achieved at the most appropriate timing. This contributes to further stability for controlling and maintaining the number of electronic components in the containers at a small amount.

Furthermore, the holders may be arranged in multiple lines along the conveying direction and in multiple rows substantially perpendicular to the conveying direction, each line being provided with one of the component-containers. The component-detecting unit may detect the presence of the electronic components for each line. Based on the detection of the presence of the electronic components for each line, the component-feeding unit may feed additional electronic components to a corresponding one of the containers.

Since each line of the holders may be provided with one of the containers and additional electronic components may be fed to the containers based on the detection value for the presence of the electronic components in each line, the electronic components in the containers may be stably controlled and maintained to have small amounts, and moreover, substantially similar amounts. Accordingly, this may shorten the time period between the aborting point of feeding of the electronic components and the termination point for conveying all remaining electronic components in the containers, and may maintain the processing efficiency at approximately 100%. The rate of operation may thus be improved.

Furthermore, the component-detecting unit may detect the presence of the electronic components in the holders in a non-contact manner.

Accordingly, each electronic component may be detected accurately, thus preventing interference with the conveying process of the components.

Alternatively, the component-detecting unit may detect the presence of the electronic components in the holders in a contact manner.

Accordingly, each electronic component may be detected accurately, thus achieving a simplified structure of the device so as to contribute to cost reduction.

The electronic-component conveying device according to preferred embodiments of the present invention may further include a component-inspection unit for electrical-property measurement and external inspection of the electronic components, a discharger for discharging defective electronic components, and a collector for collecting non-defective components. The conveying plate may convey the electronic components supplied by the containers to the component-inspection unit for measuring the electrical properties of the electronic components and for inspecting the appearance of the components. The component-inspection unit determines whether each electronic component is defective or non-defective. The defective components are conveyed to the discharger to be discharged, and the non-defective components are conveyed to the collector to be collected.

Accordingly, this structure improves the rate of operation of the conveying device, i.e. an inspection device for sorting out defective components from non-defective components, thus leading to improvement in productivity.

Other features, elements, steps, characteristics and advantages of the present invention will become more apparent from the following detailed description of preferred embodiments with reference to the attached drawings.

DETAILED DESCRIPTION OF PREFERRED EMBODIMENTS

Preferred embodiments of the present invention will now be described with reference to the attached drawings.

Figure 1:
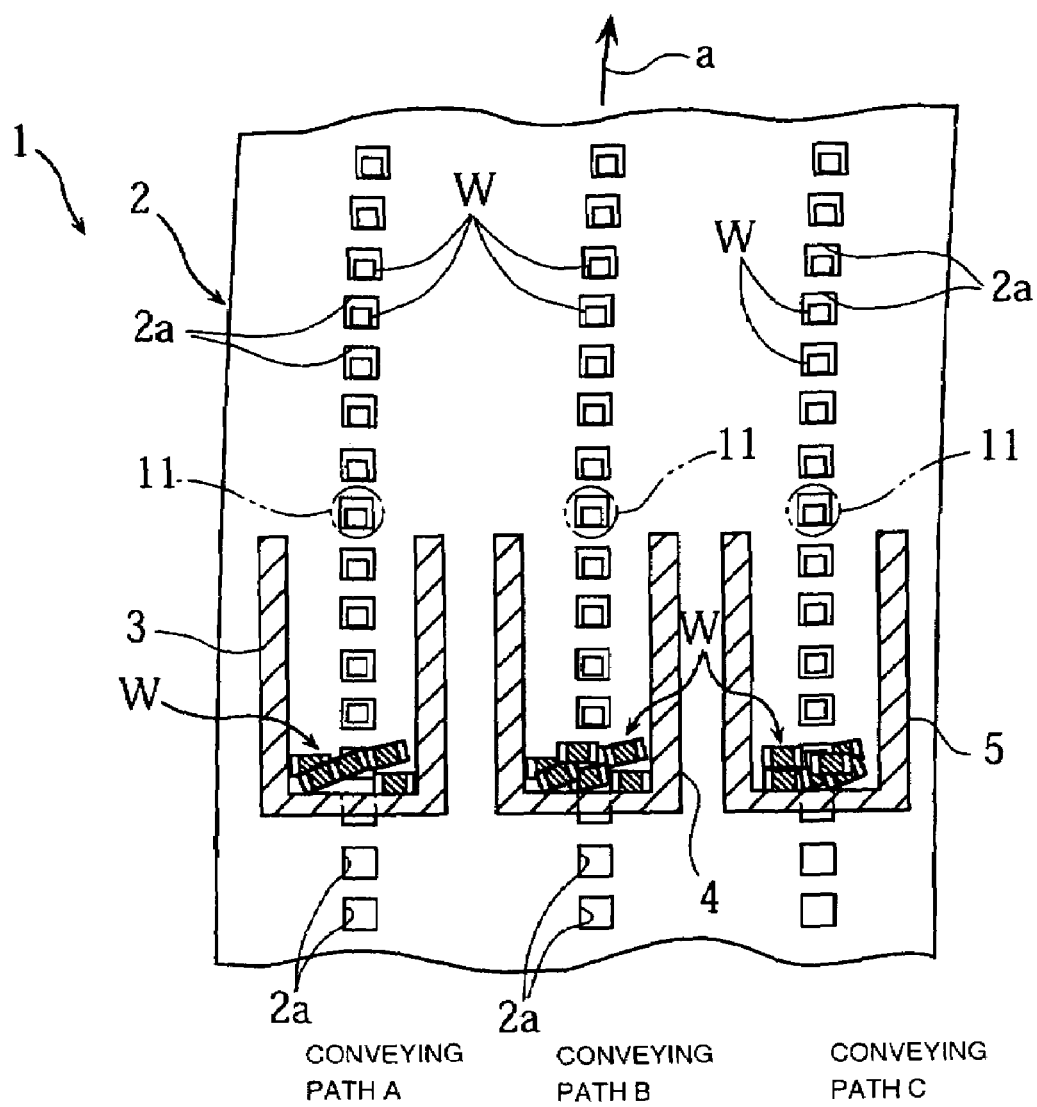
FIG. 1 is a partial plan view of a conveying plate having component-containers in an electronic-component inspection device according to a preferred embodiment of the present invention.
Figure 2:
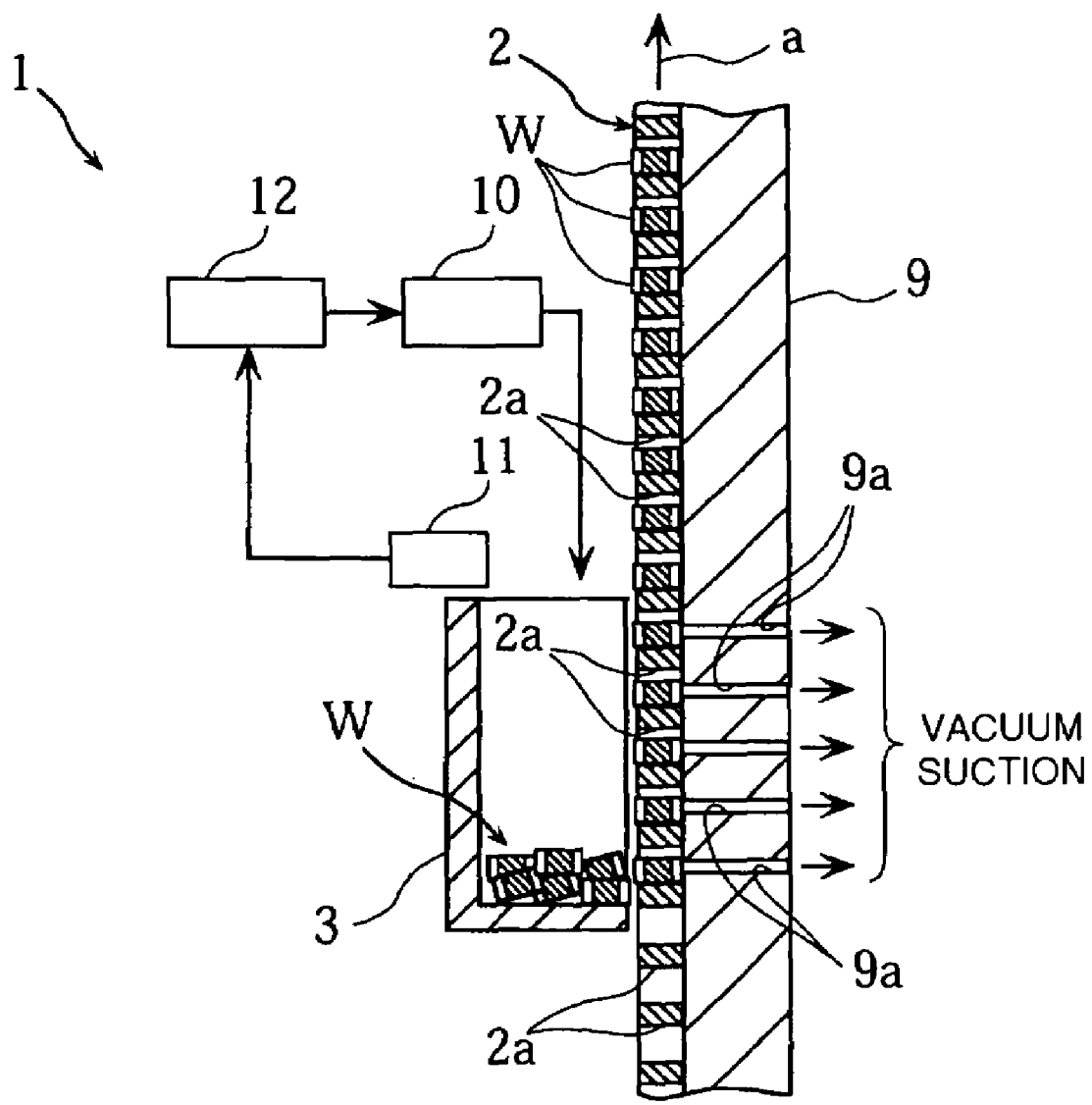
FIG. 2 is a partial cross-sectional view of one of the containers of the conveying plate.
Figure 3:
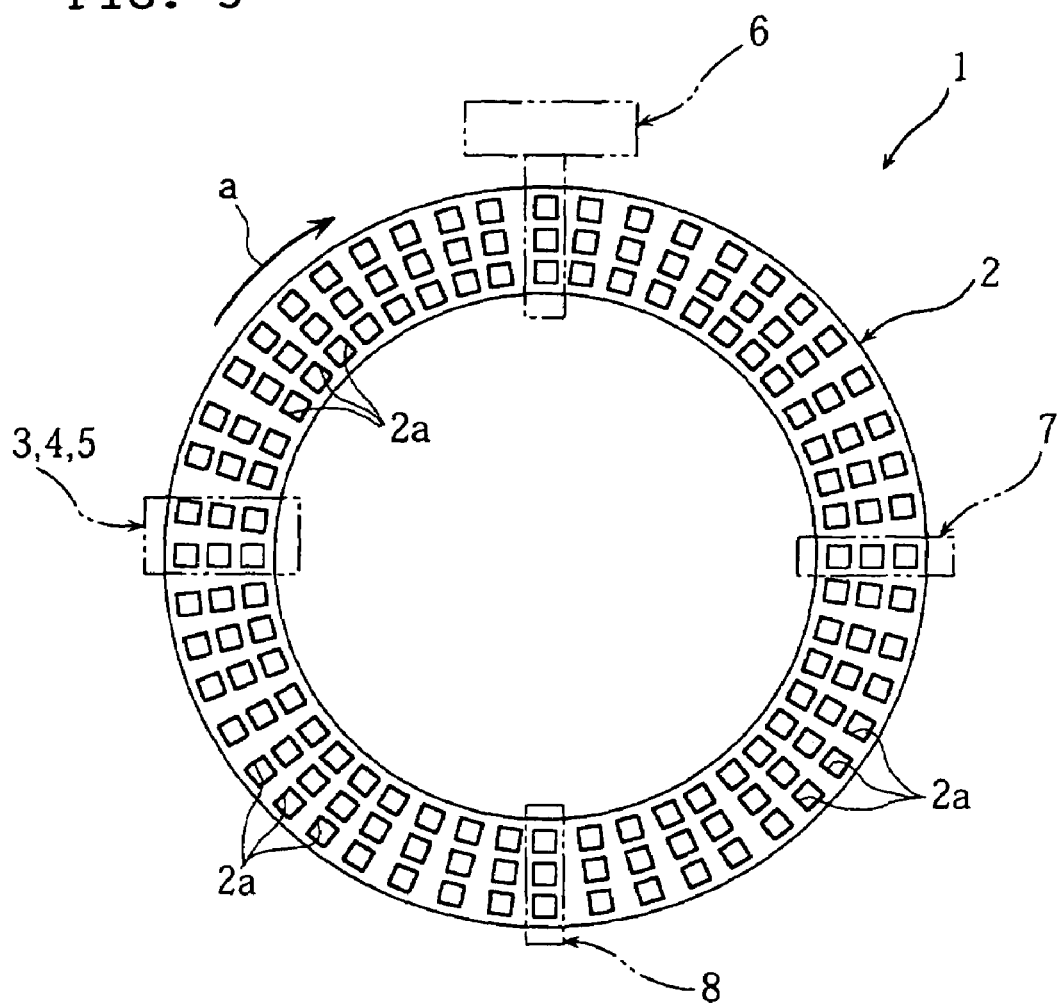
FIG. 3 is a schematic diagram of the inspection device.

FIGS. 1 to 3 are schematic diagrams of an electronic-component inspection device 1, i.e. a conveying device, according to a preferred embodiment of the present invention. FIGS. 1 and 2 are a partial plan view and a partial cross-sectional view, respectively, of a disc-shaped conveying plate 2 having component-containers 3, 4 and 5. FIG. 3 is a schematic diagram of the inspection device 1.

Referring to FIGS. 1 to 3, the inspection device 1 measures the electrical properties of electronic components W and sorts out defectives from non-defectives. The inspection device 1 includes the conveying plate 2 which rotates intermittently in a clockwise direction α, the containers 3, 4, and 5 containing the electronic components W, a component-inspection unit 6 which is disposed substantially 90° downstream from the containers 3, 4, and 5 and is provided for measuring the electrical properties of the electronic components W to determine whether each component W is defective or non-defective, a discharger 7 which is disposed substantially 90° downstream from the inspection unit 6 for removing and discharging defectives, and a collector 8 which is disposed substantially 90° downstream from the discharger 7 for collecting non-defectives. The electronic components W are, for example, preferably substantially rectangular chip-like parts having electrodes on the two longitudinal ends. Other devices to be inspected can also be used.

The conveying plate 2 is disposed at an angle so that the inspection unit 6, i.e. the upper portion, is positioned higher than the collector 8, i.e. the lower portion. Furthermore, the conveying plate 2 has multiple component-holders 2a which are provided with a vacuum suction unit for preventing the electronic components W from falling during the conveying operation. The conveying plate 2 may either be disposed vertically or horizontally. The conveying plate 2 is supported by a fixing base 9 fixed to a frame, which is not shown in the drawings, and is slidable on the upper surface of this fixing base 9.

The holders 2a are preferably arranged in three lines and each line is disposed along the circumference direction of the conveying plate 2 at a predetermined pitch, meaning that the conveying plate 2 has three conveying paths A, B, and C. Each of the holders 2a has a size that can hold one of the electronic components W. Sections of the fixing base 9 engaged with the containers 3 to 5 are provided with vacuum suction holes 9a which can communicate with the holders 2a. Each vacuum suction hole 9a is connected to a vacuum unit, which is not shown in the drawings. Accordingly, when the electronic components W contained in the containers 3 to 5 are supplied to the intermittently-rotating conveying plate 2, the components W move along with the conveying plate 2 while being held in the holders 2a by vacuum suction.

The containers 3, 4, and 5 are disposed above the respective conveying paths A, B, and C of the conveying plate 2 such that each of the containers 3, 4, and 5 covers multiple holders 2a. Each of the containers 3, 4, and 5 is provided with a component-feeder 10 for feeding the electronic components W to the corresponding container.

The inspection device 1 of this preferred embodiment further includes three cameras 11 which function as a component-detecting unit for detecting whether the electronic components W are supplied to the holders 2a from the containers 3, 4, and 5, and a controller 12 which functions as a component-feeding unit for feeding the components W to each of the containers 3, 4, and 5 via the corresponding feeder 10 based on the detection of the presence of the components W on the conveying plate 2.

The three cameras 11 are disposed adjacent to the downstream side of the containers 3, 4, and 5, respectively. The cameras 11 pick up images of the electronic components W moving along the conveying paths A, B, and C and output the images to the controller 12.

The controller 12 calculates the supplied rate of the electronic components W on each of the conveying paths A, B, and C based on the images from the corresponding camera 11. If the supplied rate on one of the paths A to C is below a certain rate, namely, for example, about 99%, or if the number of empty holders 2a on the path exceeds a certain value, namely, for example, three consecutive empty holders 2a, the controller 12 feeds about 1,000 additional electronic components W to the corresponding container.

Figure 4:
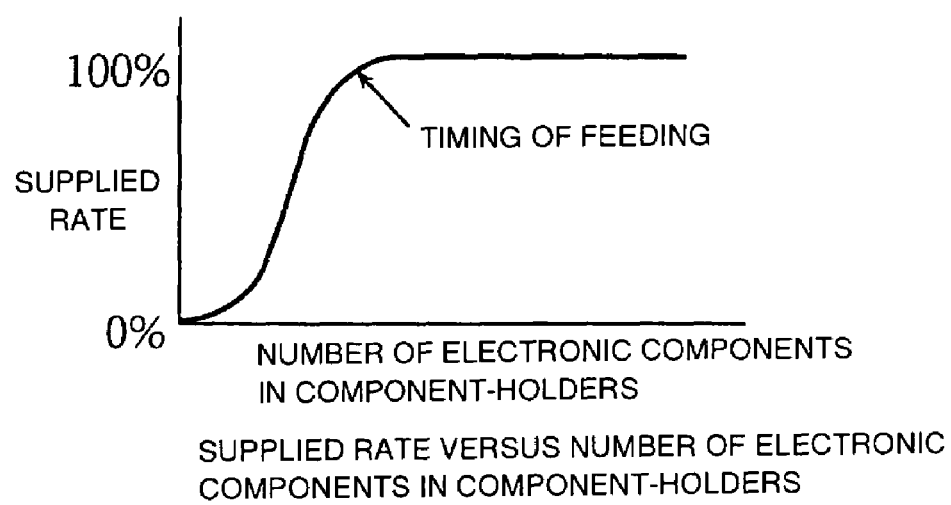
FIG. 4 is a graph describing the relationship between the supplied rate of electronic components and the number of electronic components supplied to component-holders.
Figure 5:
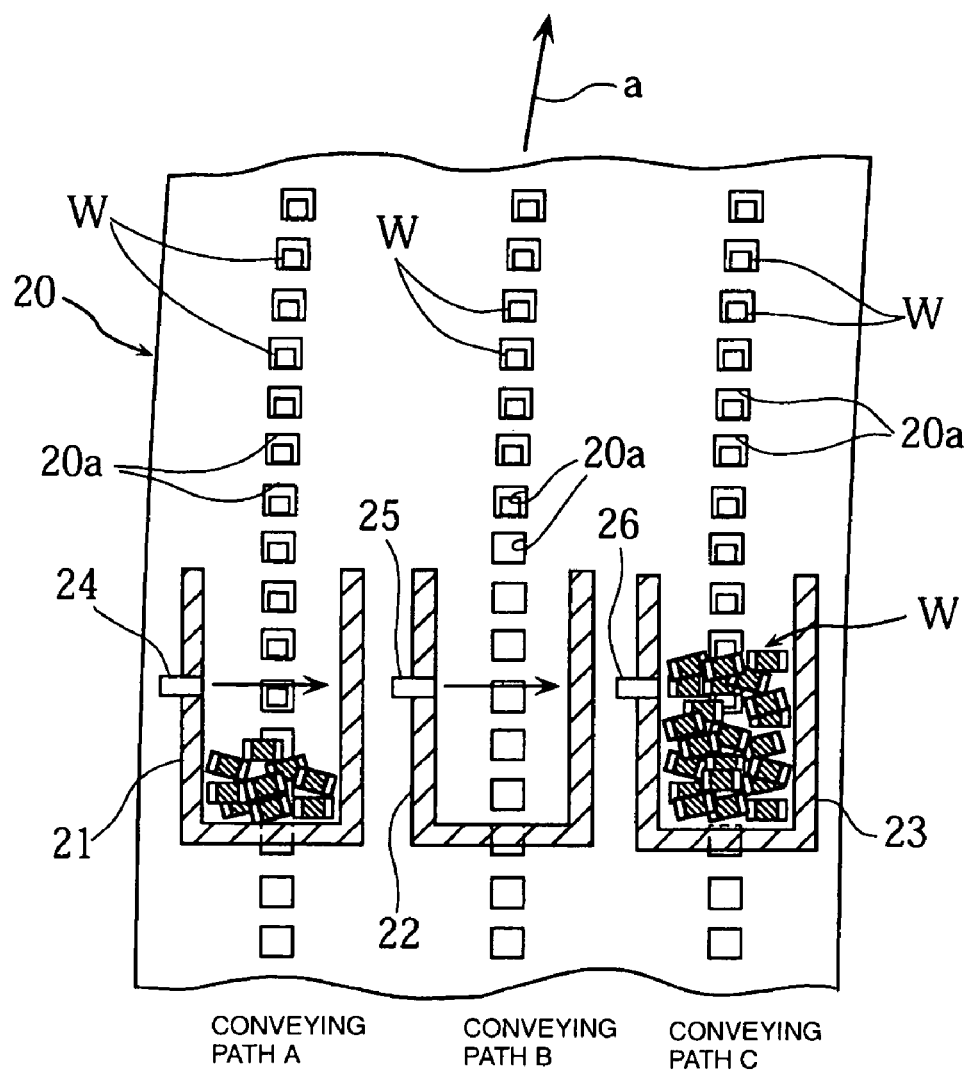
FIG. 5 is a partial plan view of a conventional conveying device.
Figure 6:
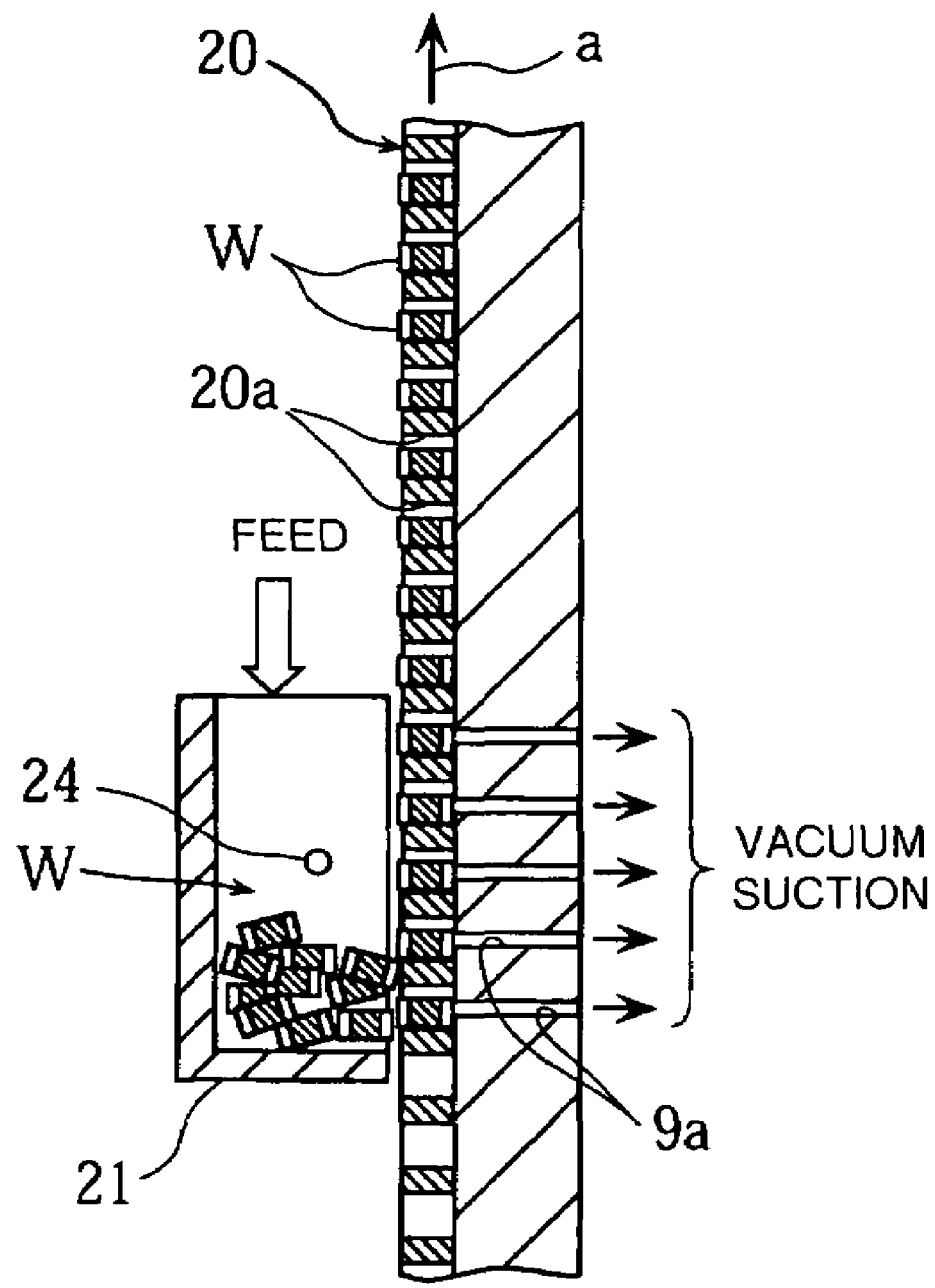
FIG. 6 is a partial cross-sectional view of the conventional conveying device.
Figure 7:
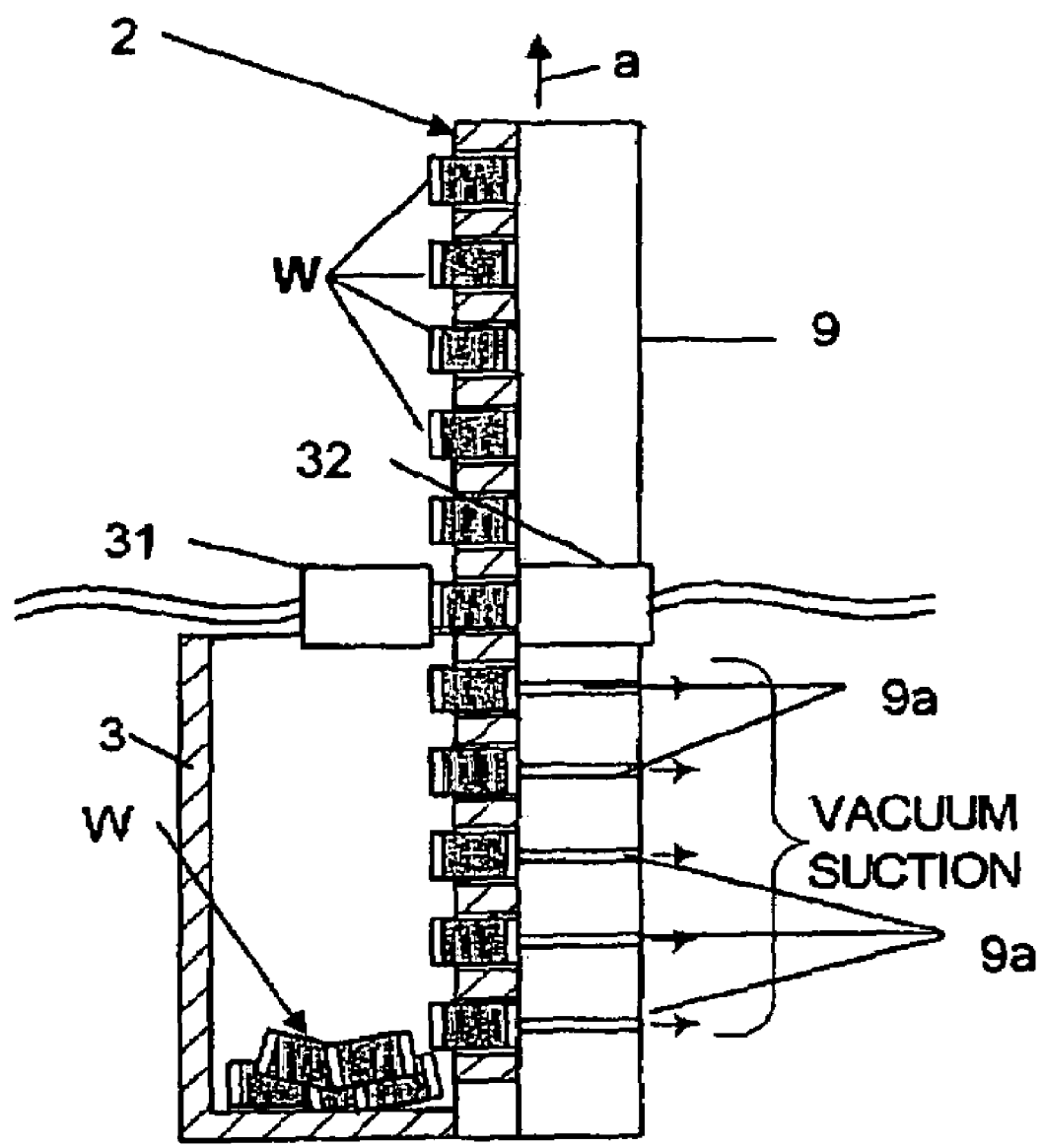
FIG. 7 is a partial cross-sectional view of one of the containers of the conveying plate according to another preferred embodiment of the present invention.

The timing for the feeding of the electronic components W may also be based on the correlation between the supplied rate and the number of empty holders 2a. Alternatively, the components W may be fed when, for example, the average supplied rate for multiple groups of electronic components W falls below about 99%, each group including, for example, 100 electronic components W. Furthermore, referring to FIG. 4, in view of the relationship between the supplied rate of the electronic components W and the number of the components W supplied to the component-holders 2a, since the number of the components W in the holders 2a tends to decrease along with the decrease of the supplied rate, the components W may be fed at the start of the decrease of the supplied rate.

In the inspection device 1 of this preferred embodiment, when the electronic components W are supplied to the rotating conveying plate 2 from the containers 3, 4, and 5, each component W is pulled into the holder 2a and is held by vacuum suction while being conveyed to the inspection unit 6. The inspection unit 6 has measuring terminals, which is not shown in the drawings, each provided for the corresponding one of the conveying paths A, B, and C. The measuring terminals come in contact with the components W and measure the electrical properties of the components W to determine whether each component W is defective or non-defective. The conveying plate 2 is further rotated to reach the discharger 7 where components W determined as defectives are externally discharged. Moreover, the conveying plate 2 rotates even further to reach the collector 8 where components W determined to be non-defectives are collected.

According to the inspection device 1, the detection of the presence of the electronic components W held by the holders 2a allows monitoring for each one of the components W on the conveying plate 2. If any problem occurs in the containers 3, 4, and 5 and the components W are not supplied to the conveying plate 2, the inspection device 1 quickly detects the dysfunctional supplying state. This prevents the conveying plate 2 from rotating in a state where the plate 2 may have empty holders 2a, thus improving operational efficiency.

In this preferred embodiment, according to the supplied rate of the electronic components W and the number of empty holders 2a based on the detection of the presence of the electronic components W on the conveying plate 2, a specific number of components W are fed to the corresponding container. This ensures the supplying of the electronic components W to the conveying plate 2. Furthermore, the electronic components W in each of the containers 3, 4, and 5 may be stably controlled and maintained at a small amount. Accordingly, this shortens the time period between the aborting point of feeding of the electronic components W for switching to another production lot and the termination point for the inspection of all remaining components W in the containers 3, 4, and 5, thus improving the rate of operation.

According to this preferred embodiment, since about 1,000 additional electronic components W are fed when the supplied rate of the components W falls below, for example, about 99% or when the number of consecutive empty holders 2a exceeds, for example, three or more, efficient feeding of the components W is achieved at the most appropriate timing. This contributes to further stability for controlling and maintaining the number of components W in the containers 3, 4, and 5 at a small amount. Accordingly, the differences in the number of the electronic components W among the containers 3, 4, and 5 are kept to within about 1,000. In comparison with conventional devices that detect the containing level of the electronic components in each container and that require an operation time of about 17 minutes in a state where the processing efficiency is lowered to ½, the operation time in the same state can be shortened to about two minutes by the inspection device 1 of various preferred embodiments of the present invention. Although the above-mentioned three consecutive empty holders 2a lower the supplied rate by about 3/1000, i.e. about 0.3%, this is not a significant problem in view of the general tolerance level, namely, a supplied rate of about 99%.

Since the containers 3, 4, and 5 are respectively provided for the conveying paths A, B, and C and the additional electronic components W are fed based on the presence of the electronic components W detected for each of the conveying paths A, B, and C, the components W in the containers 3, 4, and 5 may be stably controlled and maintained at small amounts, and moreover, substantially similar amounts. Accordingly, this may shorten the operation time to the completion of inspection for all electronic components W in the containers 3 to 5 while maintaining the processing efficiency at approximately 100%.

Since the cameras 11 pick up images of the electronic components W to detect the presence of the components W, each component W can be detected accurately without contact, thus preventing the conveying process of the components W from being affected.

Although the cameras 11 pick up images of the components W to detect the presence of the components W in the above-described preferred embodiment, an alternative non-contact detection method for the presence of the electronic components W may be applied by using, for example, fiber-optic sensors, photoelectric sensors, proximity sensors, laser sensors, or displacement sensors. Based on a signal from one of the sensors of these types, the supplied rate of the electronic components W may be calculated. The use of sensors of the above-mentioned types allows easier installation and calculation process compared to the use of the cameras 11. Alternatively, another preferred embodiment of the present invention provides detection terminals 31 and 32 which come in contact with opposed ends of the electronic components W to detect the presence of the components W. In this case, the measuring terminals provided in the inspection unit 6 described above may alternatively be used to function both as the measuring terminals and the detection terminals for detecting the presence of the electronic components W. That is, the detection terminals 31 and 32 come in contact with the components W and measure the electrical properties of the components W to determine whether each component W is defective or non-defective, in addition to detecting the presence of the components W. Accordingly, this achieves an efficient use of the already-existing measuring terminals, which may concurrently function as a component-detecting unit.

Furthermore, although an inspection device for sorting out defective electronic components from non-defective components is described as an example in the preferred embodiments described above, the conveying device according to the present invention is not limited to such a device. For example, the present invention may alternatively be applied to, for example, a packaging device for packaging electronic components by, for example, taping, or to a mounting device for mounting electronic components to substrates. In short, the present invention is applicable to any type of device that conveys multiple electronic components aligned at a predetermined pitch.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. An electronic-component conveying device comprising:
   a conveying plate which moves in one conveying direction and includes a plurality of component-holders arranged at a predetermined pitch along the conveying direction;
   at least one component-container containing a plurality of electronic components for supplying the components to at least one of the plurality of component-holders, the plurality of electronic components being held by the plurality of component-holders while being conveyed by the conveying plate;
   a component-detecting unit for detecting the presence of the plurality of electronic components in the plurality of component-holders; and
   a component-feeding unit for feeding additional electronic components to each of the component-containers based on the detection of the presence of the plurality of electronic components; wherein
   each of the plurality of component-holders holds only a single electronic component of the plurality of electronic components; and
   the component-detecting unit detects the presence of the single electronic component held in each of respective ones of the plurality of component-holders.

2. The electronic-component conveying device according to claim 1, wherein the component-feeding unit feeds a predetermined number of the additional electronic components when the supplied rate of the single electronic component of the plurality of electronic components in each of the respective ones of the plurality of component-holders falls below a certain rate, or when the number of component-holders that are empty exceeds a certain value.

3. The electronic-component conveying device according to claim 1, wherein the at least one component-container includes a plurality of component-containers, the component-holders are arranged in multiple lines along the conveying direction and in multiple rows that are substantially perpendicular to the conveying direction, each of the multiple lines being provided with one of the plurality of component-containers, the component-detecting unit detects the presence of the plurality of electronic components for each of the multiple lines, and the component-feeding unit feeds the additional electronic components to a corresponding one of the containers based on the detection of the presence of the plurality of electronic components for each of the multiple lines.

4. The electronic-component conveying device according to claim 1, wherein the component-detecting unit detects the presence of the single electronic component of the plurality of electronic components in each of the respective ones of the plurality of component-holders in a non-contact manner.

5. The electronic-component conveying device according to claim 1, wherein the component-detecting unit detects the presence of the single electronic component of the plurality of electronic components in each of the respective ones of the plurality of component-holders in a contact manner.

6. The electronic-component conveying device according to claim 1, further comprising:
   a component-inspection unit for measuring electrical properties of the plurality of electronic components and for inspecting the appearance of the plurality of electronic components to determine whether each of the plurality of electronic components is defective or non-defective, the plurality of electronic components being conveyed to the inspection unit by the conveying plate;
   a discharger for discharging the defective ones of the plurality of electronic components conveyed by the conveying plate; and
   a collector for collecting the non-defective ones of the plurality of electronic components conveyed by the conveying plate.

7. The electronic-component conveying device according to claim 1, wherein the conveying plate rotates in a clockwise direction.

8. The electronic-component conveying device according to claim 1, wherein each of the plurality of electronic components is a substantially rectangular chip components.

9. The electronic-component conveying device according to claim 1, wherein the plurality of component-holders have a vacuum suction unit for applying a vacuum to hold the single electronic components of the plurality of electronic components in each of the respective ones of the plurality of component-holders.

10. The electronic-component conveying device according to claim 1, wherein the component-detecting unit includes a plurality of cameras for detecting each of the single electronic components of the plurality of electronic components.

11. The electronic-component conveying device according to claim 10, further comprising a controller calculating a supplied rate of the plurality of electronic components based on images obtained from the plurality of cameras.

12. The electronic-component conveying device according to claim 11, wherein if the supplied rate is below a certain rate, the controller feeds additional electronic components to at least one of the component-containers.

13. The electronic-component conveying device according to claim 1, wherein the component-detecting unit includes at least one of a plurality of cameras, a plurality of fiber-optic sensors, a plurality of photoelectric sensors, a plurality of proximity sensors, a plurality of laser sensors, and a plurality of displacement sensors, for detecting each of the single electronic components of the plurality of electronic components.

14. The electronic-component conveying device according to claim 13, further comprising a controller calculating a supplied rate of the plurality of electronic components based on signals from the at least one of the plurality of cameras, the plurality of fiber-optic sensors, the plurality of photoelectric sensors, the plurality of proximity sensors, the plurality of laser sensors, and the plurality of displacement sensors.

15. The electronic-component conveying device according to claim 14, wherein if the supplied rate is below a certain rate, the controller feeds additional electronic components to at least one of the component-containers.

16. The electronic-component conveying device according to claim 5, wherein the component-detecting unit includes at least two detection terminals and the at least two detection terminals come in contact with a respective one of the plurality of electronic components to detect the presence of the respective one of the plurality of electronic components.

17. The electronic-component conveying device according to claim 16, wherein the at least two detection terminals also measure the electrical properties of the respective one of the plurality of electronic components to determine whether the respective one of the plurality of electronic components is defective or non-defective.

18. An electronic-component conveying device comprising:
 a conveying plate which moves in one conveying direction and includes a plurality of component-holders arranged at a predetermined pitch along the conveying direction;
 at least one component-container containing a plurality of electronic components for supplying the components to at least one of the plurality of component-holders, the plurality of electronic components being held by the plurality of component-holders while being conveyed by the conveying plate;
 a component-detecting unit for detecting the presence of the plurality of electronic components in the plurality of component-holders; and
 a component-feeding unit for feeding additional electronic components to each of the component-containers based on the detection of the presence of the plurality of electronic components; wherein
 the component-detecting unit includes a plurality of cameras for detecting the components and a controller calculating a supplied rate of the plurality of electronic components based on images obtained from the plurality of cameras.

* * * * *